United States Patent [19]

Iwabuchi et al.

[11] Patent Number: 5,668,372
[45] Date of Patent: Sep. 16, 1997

[54] SCANNING ELECTRON MICROSCOPE AND ITS ANALOGOUS DEVICE

[75] Inventors: Yuko Iwabuchi, Mito; Mitsugu Sato, Hitachinaka; Yoichi Ose, Mito, all of Japan

[73] Assignee: Hitachi, Ltd., Tokyo, Japan

[21] Appl. No.: 615,650

[22] Filed: Mar. 13, 1996

[30] Foreign Application Priority Data

Mar. 17, 1995 [JP] Japan ................... 7-059376

[51] Int. Cl.⁶ ................................. H01J 37/244
[52] U.S. Cl. ................................. 250/310
[58] Field of Search ................... 250/310, 311, 250/396 R, 396 ML, 397

[56] References Cited

U.S. PATENT DOCUMENTS 4,658,136  4/1987  Ohtaka et al. ............... 250/310
4,922,097  5/1990  Todokoro et al. ............ 250/310
5,387,793  2/1995  Sato et al. .................. 250/310

*Primary Examiner*—Kiet T. Nguyen
*Attorney, Agent, or Firm*—Kenyon & Kenyon

[57] ABSTRACT

A device enables high resolution observation even when a sample is tiled. A deflecting electrode device for generating an electric field having a component in the direction perpendicular to the center axis (optical axis) of an objective lens is provided between the objective lens and the sample. A voltage applied to the deflecting electrode device is controlled in accordance with the tilting of a sample stage. A lateral electric field component generated on the optical axis when the sample stage is tiled is corrected by a deflected electric field generated by the deflecting electrode device. This is effective to suppress generation of astigmatism, and to allows effective arrival of an secondary electron at a secondary electron detector disposed at a position nearer the electron source side than the objective lens.

11 Claims, 2 Drawing Sheets

SCANNING ELECTRON MICROSCOPE AND ITS ANALOGOUS DEVICE

BACKGROUND OF THE INVENTION

The present invention relates to a device suitable for obtaining a scanning image of a sample on the basis of an information signal, peculiar to the sample, obtained by emission of an electron beam to the sample.

A method for observing a sample at high resolution using a scanning electron microscope or the like has been described in Japanese Patent Laid-open No. Sho 57-172643, in which a lens magnetic field is generated at a lower portion of an objective lens; a secondary electron generated from the sample is accelerated by a positive voltage applied to electrodes disposed on an objective lens portion; and the secondary electron is detected at a portion over the objective lens. On the other hand, a so-called retarding method is intended to decelerate a primary electron directly before a sample by applying a negative voltage to the sample. Even in this retarding method, a secondary electron generated from a sample is accelerated by a voltage applied to the sample and advances over the objective lens, and thereby it must be detected at a portion over the objective lens. In each method, an electric field is generated between the sample and the objective lens.

In the above-described prior art methods, when a conductive sample is tilted, an axisymmetric property of an electric field between a sample and an objective lens is put into disorder, and consequently a lateral electric field component is generated on the optical axis of the electron beam. This is inconvenient in increasing astigmatism, thereby making poor resolution. The disorder of the axisymmetric property of an electric field also disturbs the orbit of a secondary electron generated from the sample, and obstructs effective arrival of the secondary electron at a detector disposed over the objective lens. This results in lowering of the detection efficiency of the secondary electron.

SUMMARY OF THE INVENTION

An object of the present invention is to provide a scanning electron microscope and its analogous device suitable for suppressing generation of astigmatism even when a sample stage is tilted, thereby preventing lowering of resolution.

Another object of the present invention is to provide a scanning electron microscope and its analogous device suitable for preventing lowering of a detection efficiency of a secondary electron detected after passing through an objective lens.

Main features of the present invention are as follows.

A scanning electron microscope and its analogous device according to a first aspect of the present invention, includes: an electron gun for generating an electron beam; an objective lens for converging the electron beam to a sample so as to allow emission of the electron beam on the sample; a deflector for deflecting the electron beam so as to allow the electron beam to scan the sample; a detector for detecting an information signal, peculiar to the sample, generated from the sample by emission of the electron beam; a means for tilting the sample with respect to the electron beam; and a means for correcting a nonaxisymmetric property, due to the tilting of the sample, of an electric field applied to the electron beam to be emitted on the sample; wherein the nonaxisymmetric property correcting means includes a deflecting electrode means to which a variable voltage is applied for generating an electric field having a component in the direction perpendicular to the optical axis of the electron beam.

A scanning electron microscope and its analogous device according to a second aspect of the present invention, includes: an electron gun for generating an electron beam; an objective lens converging the electron beam to a sample so as to allow emission of the electron beam on the sample; a means for deflecting the electron beam so as to allow the electron beam to scan the sample; a means for generating an electric field having a component in the direction of the optical axis of the electron beam so as to extract, through said objective lens, a secondary electron generated from the sample by emission of the electron beam; a detector for detecting the extracted secondary electron; a means for tilting the sample with respect to the electron beam; and a means for correcting a nonaxisymmetric property, due to the tilting of the sample, of the electric field applied to the electron beam to be emitted on the sample; wherein the nonaxisymmetric property correcting means includes a deflecting electrode device to which a variable voltage is applied for generating an electric field having a component in the direction perpendicular to the optical axis of the electron beam.

The above scanning electron microscope and its analogous device may further include a means for detecting a tilting angle of the sample and controlling the voltage applied to the deflecting electrode device on the basis of the detected tilting angle.

In the above scanning electron microscope and its analogous device, the deflecting electrode device may include at least two pieces of electrodes disposed between said objective lens and the sample in such a manner as to be positioned around the optical axis of the electron beam.

In the above scanning electron microscope and its analogous device, said deflecting electrode device may include deflecting electrodes disposed opposite to the sample with respect to the optical axis of the electron beam.

As described above, the present invention includes at least a means for correcting a nonaxisymmetric property, due to the tilting of the sample, of an electric field applied to the electron beam to be emitted on the sample, wherein the nonaxisymmetric property correcting means includes a deflecting electrode means to which a variable voltage is applied for generating an electric field having a component in the direction perpendicular to the optical axis of the electron beam. Accordingly, when a sample is tilted, generation of astigmatism can be suppressed by changing a voltage applied to the deflecting electrode means for generating an electric field component being large sufficient to compensate for an irregular electric component generated in the direction perpendicular to the optical axis of the electron beam, to thereby prevent lowering of resolution due to the astigmatism.

The generation of an effective electric field component by the deflecting electrode mean exhibits another effect. Specifically, when a secondary electron generated from a tilted sample is detected after being extracted through an objective lens, an irregular electric field component generated in the direction perpendicular to the optical axis of the electron beam disturbs the orbit of the secondary electron, thereby lowering the detection efficiency of the secondary electron. The lowering of the detection efficiency of the secondary electron, however, can be prevented by changing a voltage applied to the deflecting electrode means for generating an electric field component being large sufficient to compensate for the irregular electric field component.

In addition, the device of the present invention is excellent in operability because a voltage applied to the deflecting electrode means can be changed in accordance with the tilting of a sample.

DESCRIPTION OF THE PREFERRED EMBODIMENT

Figure 1:
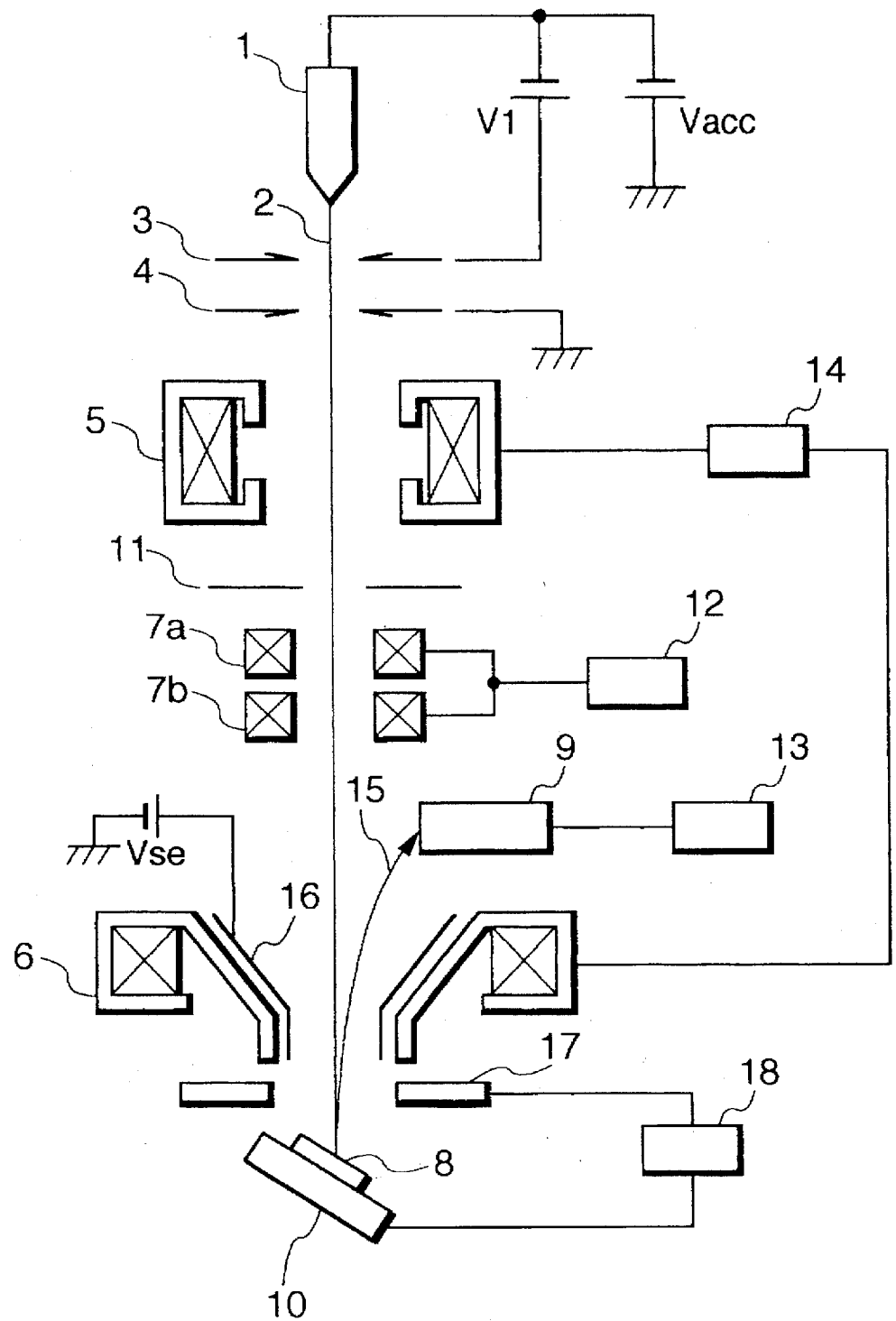
FIG. 1 is a schematic view showing a configuration of one embodiment of a scanning electron microscope according to the present invention.
Figure 2:
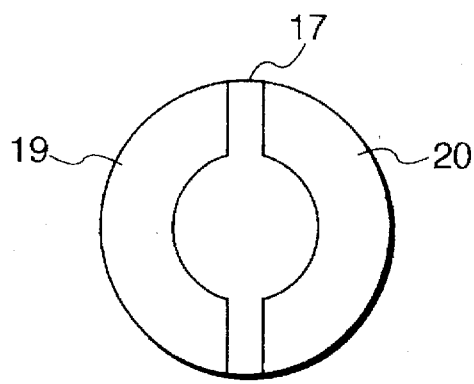
FIG. 2 is a view showing a configuration of a deflecting electrode shown in FIG. 1.

FIG. 1 is a view showing a configuration of one embodiment of the present invention. When a voltage V1 is applied between a cathode 1 of an electron gun and an extraction electrode 3, a primary electron beam 2 is discharged from the cathode 1. The primary electron beam 2 is accelerated by a voltage Vacc applied between the cathode 1 and an accelerating electrode 4, and is then emitted to be converged to a sample 8 through a convergent lens 5 controlled by a lens controller 14 and an objective lens 6. Deflectors 7a, 7b deflect the primary electron beam 2 two-dimensionally so that the primary electron 2 scans the sample 8 two-dimensionally. A scanning signal supplied to the deflectors 7a, 7b is controlled by a deflection control circuit 12 on the basis of an observation magnification. A secondary electron beam 15 generated from the sample 8 by emission of the primary electron beam is accelerated by a voltage Vse applied to a lifting electrode 16 which generates an electric field having a component in the direction of the optical axis of the primary electron beam 2, and is detected by a secondary electron detector 9 by way of the objective lens 6. An enlarged image of the sample is thus displayed on an image display 13. A deflecting electrode device 17 is composed of two electrodes 19, 20 symmetrically disposed with respect the optical axis of the electron beam, as shown in FIG. 2. Different voltages, which are respectively applied to the electrodes 19, 20, are controlled by a control unit 18 in accordance with the tilting of a sample stage 10 mounting the sample 8. As the tilting angle of the sample stage is increased, a different in the applied voltages between the group of the electrodes which are apart from the sample stage and the remaining group of the electrodes which are near the sample stage is controlled to be increased. The suitable selection of these voltages enables generation of an electric field component being large sufficient to compensate for an irregular electric field component generated in the direction perpendicular to the axis of the electron beam due to the tilting of the sample. This is effective to correct the nonaxisymmetric property, due to the tilting of the sample, of the electric field applied to the electron beam, and hence to suppress generation of astigmatism as a cause of lowering of resolution.

The generation of an effective electric field component by the deflecting electrode device 17 exhibits another effect.

Specifically, when a secondary electron generated from a tilted sample is detected after being extracted through an objective lens, an irregular electric field component generated in the direction perpendicular to the optical axis of the electron beam disturbs the orbit of the secondary electron, thereby lowering the detection efficiency of the secondary electron. The lowering of the detection efficiency of the secondary electron, however, can be prevented by changing a voltage applied to the deflecting electrode device 17 for generating an electric field component being large sufficient to compensate for the irregular electric field component.

A voltage applied to the deflecting electrode device 17 can be manually changed; however, the voltage is desirable to be automatically changed in practice. In this case, experiments have been made for obtaining a relationship for correcting an irregular electric field, that is, an nonaxisymmetric property of an electric field applied to an electron beam. In other words, a relationship of a voltage applied between the electrodes 19, 20 to a tilting angle of a sample has been previously obtained by experiments. Thus, the control unit 18 automatically changes, on the basis of the experimental results, a voltage applied between the electrodes 19, 20 in accordance with a variable tilting angle of the sample.

Figure 3:
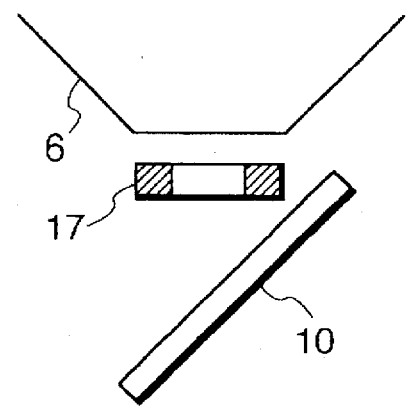
FIG. 3 is a view showing a positional relationship between an objective lens, a sample stage and the deflecting electrode shown in FIG. 1.
Figure 4:
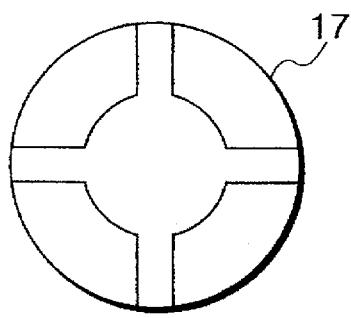
FIG. 4 is a view, similar to FIG. 2, showing another configuration of the deflecting electrode.
Figure 5:
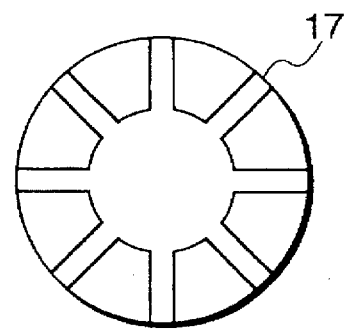
FIG. 5 is a view, similar to FIG. 2, showing a further configuration of the deflecting electrode.

FIG. 3 shows an arrangement example of the deflecting electrode device 17, in which the device 17 is arranged between the lower surface of the objective lens 6 and a sample in such a manner as to be positioned around the optical axis of an electron beam. As shown in FIGS. 2, 4 or 5, the deflecting electrode device 17 may be composed of two, four or eight electrodes, to which different voltages are applied. A voltage applied to each electrode of the deflecting electrode device 17 is automatically controlled in accordance with the tilting of the sample stage 10, that is, the sample 8 by the control unit 18. In this case, it is apparent that lowering of resolution can be prevented and also effective detection of a secondary electron can be performed for the same reason as described above.

Figure 6:
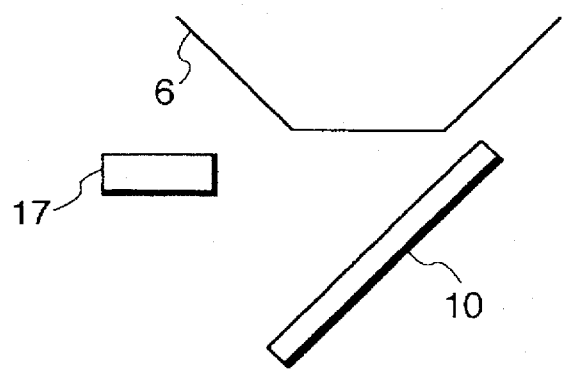
FIG. 6 is a view, similar to FIG. 3, showing another positional relationship between the objective lens, sample stage and deflecting electrode.

FIG. 6 shows another arrangement example of the deflecting electrode device 17, in which the device 17 is disposed opposite to the sample 8, that is, the sample stage 10 tilted with respect to the optical axis of an electron beam. A voltage applied to the device 17 is controlled in accordance with the tilting of the sample stage 10 by the control unit 18. Even in this case, when a voltage is applied to the deflecting electrode device 17, an electric field having a component in the direction perpendicular to the optical axis of the electron beam is generated. The electric field component thus generated corrects a lateral electric field component generated on the optical axis of the electron beam when the sample stage 10 is tilted, to suppress generation of astigmatism. As a result, it becomes possible to correct astigmatism, and to realize effective detection of a secondary electron 15 generated from the sample 8.

According to the present invention, generation of astigmatism can be prevented by changing a voltage applied to the deflecting electrode means for generating an electric field component being large sufficient to compensate for an irregular electric component generated in the direction perpendicular to the optical axis of the electron beam when a sample is tilted, to thereby prevent lowering of resolution due to the astigmatism.

The generation of an effective electric field component by the deflecting electrode mean 17 exhibits another effect. Specifically, when a secondary electron generated from a tilted sample is detected after being extracted through an objective lens, an irregular electric field component generated in the direction perpendicular to the optical axis of the electron beam disturbs the orbit of the secondary electron, thereby lowering the detection efficiency of the secondary electron. The lowering of the detection efficiency of the secondary electron, however, can be prevented by changing a voltage applied to the deflecting electrode means for generating an electric field component being large sufficient to compensate for the irregular electric field component.

In addition, the device of the present invention is excellent in operability because a voltage applied to the deflecting electrode means can be changed in accordance with the tilting of a sample.

The change in a voltage applied to the deflecting electrode device 17 will be fully described using the deflecting electrodes shown in FIG. 3.

The orbit of a secondary electron generated from a sample by emission of an electron beam is required to be changed in such a manner that the secondary electron is introduced to a secondary electron detector by way of the objective lens. To satisfy such requirement, in the case where the sample stage 10 mounting the sample is tilted as shown in FIG. 3, a voltage applied to the electrode which is separated apart from the sample stage is set on the negative side as compared with a voltage applied to the electrode which moves near the sample stage.

Specifically, although a secondary electron generated from the sample on the sample stage 10 directs in the perpendicular direction of the sample stage 10 due to the tilting of the sample stage 10, it is pushed back to the center axis of the objective lens by applying a voltage on the negative side to the electrode apart from the sample stage as compared with the electrode near the sample stage, thereby improving the detection efficiency of the secondary electron.

As long as the above relationship is kept, that is, a voltage on the negative side is applied to an electrode apart from the sample stage as compared with an electrode near the sample stage, the same effect as described above can be usually obtained even when a voltage applied to one electrode is zero or when positive voltages are applied to both the electrodes. Additionally, in the case where both the electrodes are applied with positive voltages, they function as the deflecting electrodes serving as extraction electrodes for a secondary electron.

We claim:

1. A scanning electron microscope comprising:

an electron gun for generating an electron beam;

an objective lens for converging the electron beam to a sample so as to allow emission of the electron beam on the sample;

a deflector for deflecting the electron beam so as to allow the electron beam to scan the sample;

a detector for detecting an information signal, peculiar to the sample, generated from the sample by irradiation of the electron beam;

a means for tilting the sample with respect to the electron beam; and a means for correcting a nonaxisymmetric property, due to the tilting of the sample, of an electric field applied to the electron beam to be emitted on the sample;

wherein the nonaxisymmetric property correcting means includes a deflecting electrode means to which a variable voltage is applied for generating an electric field having a component in the direction perpendicular to an optical axis of the electron beam.

2. A scanning electron microscope according to claim 1, further comprising a means for detecting a tilting angle of the sample and controlling the voltage applied to said deflecting electrode means in accordance with the detected tilting angle.

3. A scanning electron microscope according to claim 1, wherein said deflecting electrode means includes deflecting electrodes disposed opposite to the tilted sample with respect to the optical axis of the electron beam.

4. A scanning electron microscope comprising:

an electron gun for generating an electron beam;

an objective lens for converging the electron beam to a sample so as to allow emission of the electron beam on the sample;

a means for deflecting the electron beam so as to allow the electron beam to scan the sample;

a means for generating an electric field having a component in the direction of an optical axis of the electron beam so as to extract, through said objective lens, a secondary electron generated from the sample by irradiation of the electron beam;

a detector for detecting the extracted secondary electron;

a means for tilting the sample with respect to the electron beam; and a means for correcting a nonaxisymmetric property, due to the tilting of the sample, of an electric field applied to the electron beam to be emitted on the sample;

wherein the nonaxisymmetric property correcting means includes a deflecting electrode means to which a variable voltage is applied for generating an electric field having a component in the direction perpendicular to the optical axis of the electron beam.

5. A scanning electron microscope according to claim 4, further comprising a means for detecting a tilting angle of the sample and controlling the voltage applied to said deflecting means in accordance with to the detected tilting angle.

6. A scanning electron microscope according to claim 4, Said deflecting electrode means includes at least two pieces of electrodes disposed between said objective lens and the sample in such a manner as to be positioned around the optical axis of the electron beam.

7. A scanning electron microscope according to claim 4, wherein said deflecting electrode means includes deflecting electrodes disposed opposite to the tilted sample with respect to the optical axis of the electron beam.

8. A scanning electron microscope comprising:

an electron gun for generating an electron beam;

an objective lens for converging the electron beam to a sample so as to allow emission of the electron beam on the sample;

a deflector for deflecting the electron beam so as to allow the electron beam to scan the sample;

a detector for detecting an information signal, peculiar to the sample, generated from the sample by irradiation of the electron beam;

a means for tilting a sample stage mounting the sample; and a plurality of electrodes disposed under said objective lens;

wherein voltages applied to a group of a plurality of said electrodes which are separated apart from the sample stage when the sample stage is tilted are set on a negative side as compared with voltages applied to a remaining group of said electrodes which move near the sample stage when the sample stage is tilted.

9. A scanning electron microscope according to claim 8, wherein as a tilting angle of the sample stage is increased, a difference in the applied voltages between said group of said electrodes which are apart from the sample stage and the remaining group of said electrodes which are near the sample stage is controlled to be increased.

10. A scanning electron microscope according to claim 8, wherein a plurality of said electrodes are disposed between said objective lens and the sample in such a manner as to be positioned around the optical axis of the electron beam.

11. A scanning electron microscope according to claim 8, wherein a plurality of said electrodes includes deflecting electrodes disposed opposite to the tilted sample with respect to the optical axis of the electron beam.

* * * * *